United States Patent
Washkurak et al.

(10) Patent No.: US 7,846,760 B2
(45) Date of Patent: Dec. 7, 2010

(54) DOPED PLUG FOR CCD GAPS

(75) Inventors: William D. Washkurak, Acton, MA (US); Michael P. Anthony, Andover, MA (US); Gerhard Sollner, Winchester, MA (US)

(73) Assignee: Kenet, Inc., Chelmsford, MA (US)

( * ) Notice: Subject to any disclaimer, the term of this patent is extended or adjusted under 35 U.S.C. 154(b) by 551 days.

(21) Appl. No.: 11/807,911

(22) Filed: May 30, 2007

(65) Prior Publication Data
US 2008/0042169 A1      Feb. 21, 2008

Related U.S. Application Data

(60) Provisional application No. 60/809,773, filed on May 31, 2006.

(51) Int. Cl.
*H01L 21/00* (2006.01)
(52) U.S. Cl. .................... 438/60; 438/144; 438/145; 438/552; 257/E21.617; 257/E27.083; 257/E27.154; 257/E27.162; 257/E29.088
(58) Field of Classification Search ............. 438/60, 438/144, 145, 552, 587, 934; 257/E21.617, 257/27.083, 154, 162, E29.088
See application file for complete search history.

(56) References Cited

U.S. PATENT DOCUMENTS

| | | | | | |
|---|---|---|---|---|---|
| 3,810,795 | A | * | 5/1974 | Troutman | 438/587 |
| 3,865,652 | A | * | 2/1975 | Agusta et al. | 438/144 |
| 4,139,784 | A | * | 2/1979 | Sauer | 377/57 |
| 4,173,064 | A | * | 11/1979 | Farnow | 438/79 |
| 4,660,090 | A | * | 4/1987 | Hynecek | 348/311 |
| 4,679,212 | A | * | 7/1987 | Hynecek | 377/58 |
| 5,736,757 | A | * | 4/1998 | Paul | 257/236 |
| 7,154,134 | B2 | * | 12/2006 | Anthony et al. | 257/238 |
| 7,479,675 | B2 | * | 1/2009 | Adachi | 257/292 |

FOREIGN PATENT DOCUMENTS

EP      0 009 438 A1      4/1980

OTHER PUBLICATIONS

Yamada, T., et al., "Driving Voltage Reduction in a Two-Phase CCD by Suppression of Potential Pockets in Inter-Electrode Gaps," *IEEE Trans Elec Dev.*, 44(10): 1580-1587 (1997).
Nakamura, N., et al., "TP 13.3: Single-Layer Metal-Electrode CCD Image Sensors," *IEEE Intl. Solid State Circuits*, 38: 222-223, 372 (1995).
Furumiya, M., et al., "A 1/2-in. 1.3M-Pixel Progressive-Scan CCD Image Sensor Employing 0.25-μm Gap Single-Layer Poly-Si Electrodes," *IEEE Intl. Solid State Circuits*, 34(12): 1835-1842 (1999).
Sequin, C.H., et al., "A Symmetrically Balanced Linear Differential Charge-Splitting Input for Charge-Coupled Devices," *IEEE Trans Elec Dev.*, ED-24(6): 746-750 (1977).

* cited by examiner

*Primary Examiner*—Michael S Lebentritt
(74) *Attorney, Agent, or Firm*—Hamilton, Brook, Smith & Reynolds, P.C.

(57) ABSTRACT

A method and structure of providing a doped plug to improve the performance of CCD gaps is discussed. A highly-doped region is implemented in a semiconductor, aligned beneath a gap. The plug provides a highly-conductive region at the semiconductor surface, therefore preventing the development of a region where potential is significantly influenced by surface charges.

8 Claims, 5 Drawing Sheets

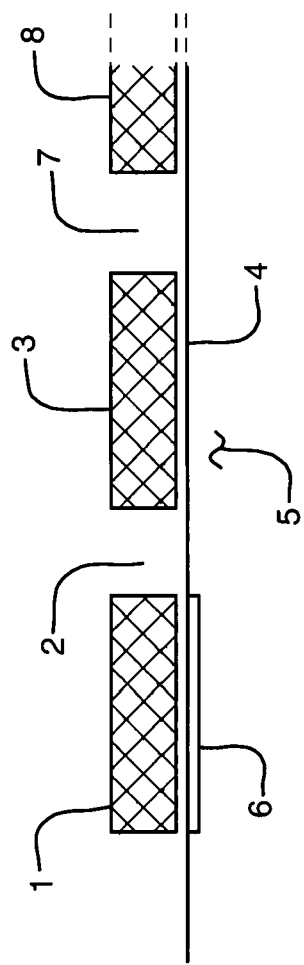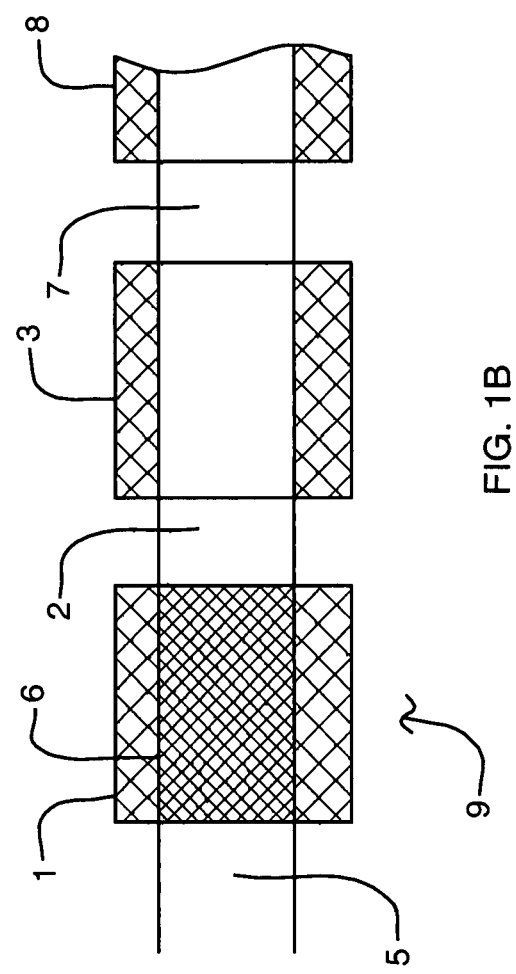

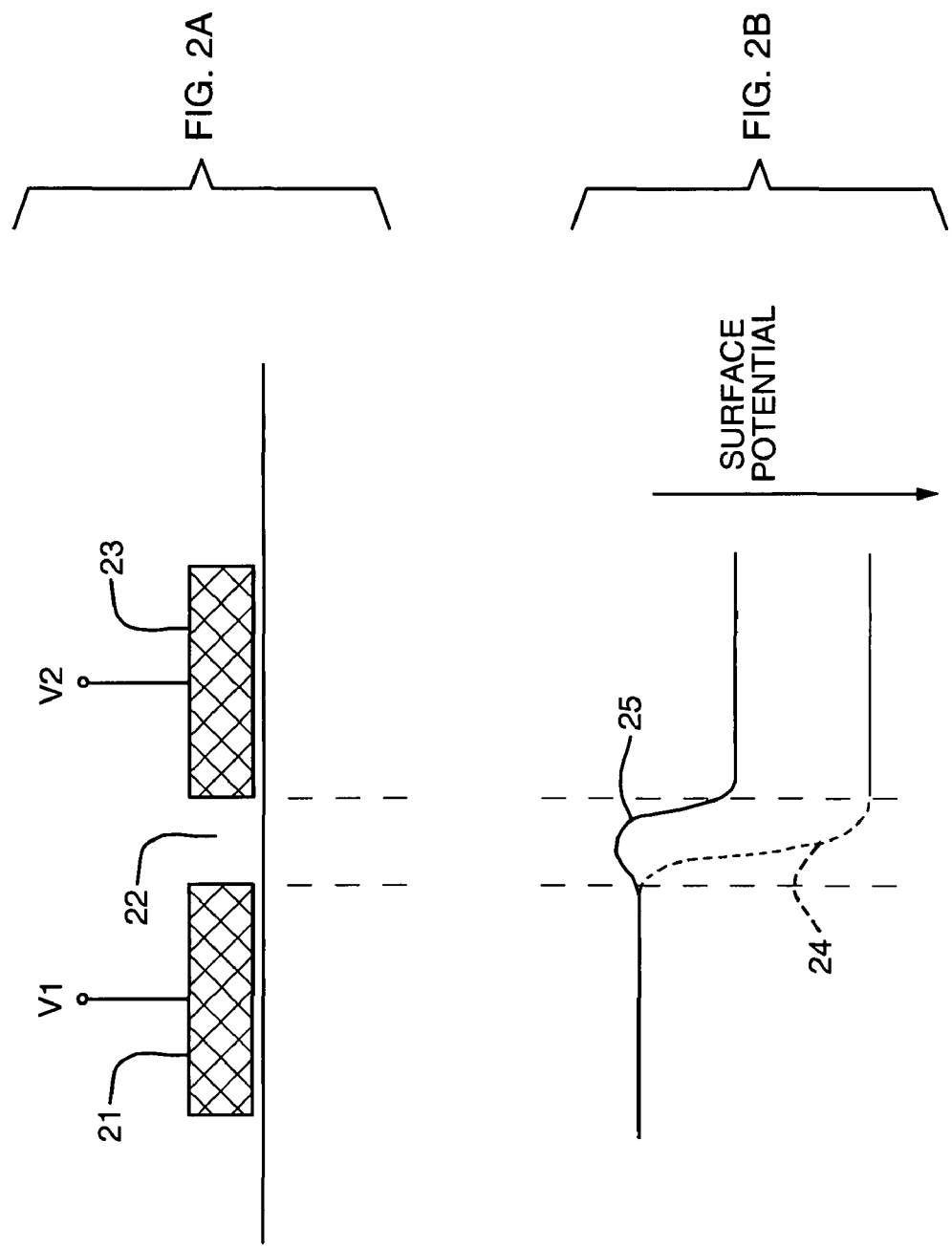

US 7,846,760 B2

DOPED PLUG FOR CCD GAPS

RELATED APPLICATION

This application claims the benefit of U.S. Provisional Application No. 60/809,773, filed on May 31, 2006. The entire teachings of the above application(s) are incorporated herein by reference.

BACKGROUND OF THE INVENTION

A Charge Coupled Device (CCD) is a series of Metal Oxide Semiconductor (MOS) capacitors closely located next to each other so that signal charge can be transferred from one capacitor to the next in shift register like action. For example, CCDs may be used in image sensors to transfer photo-generated signal charges from light sensitive capacitors to an output.

FIG. 1 illustrates a single-poly, surface-channel CCD shift register formed in a MOS or a Complementary Metal Oxide Semiconductor (CMOS) process. FIG. 1A shows a cross-section of an example of a CCD shift register, and FIG. 1B shows a plan view of the CCD shift register. The example CCD shift register includes three gates, 1, 3 and 8, separated by gaps 2 and 7. The gates reside above a gate-oxide layer 4, over a region of active semiconductor 5. The active region is surrounded by an isolation region 9. The gap regions are filled with a dielectric material. A charge packet 6 is held in an inversion layer under gate 1, at the top surface of the semiconductor (adjacent to the gate oxide), and can be transferred to the adjacent and subsequent gates. When charge is transferred from gate 1 to gate 3, for example, it may pass along the semiconductor surface underlying the gap region 2. A typical CCD shift register has many gates similar to the three shown in FIG. 1.

SUMMARY OF THE INVENTION

FIG. 2 illustrates the conditions for transferring charge from one gate across the gap to the next gate. Such a charge transfer requires establishing an appropriate potential profile along the semiconductor surface. FIG. 2A shows two adjacent gates 21 and 23 separated by a gap 22, and connections for establishing voltage biases on the gates. FIG. 2B shows representative surface-potential profiles resulting from such biasing. Gate 21, with charge under it, is biased by applied voltage V1 to produce a low surface potential beneath the gate. Meanwhile, gate 23, about to receive charge, is biased by V2 to produce a high surface potential. The combined gate biasing creates a potential gradient 24 at the semiconductor surface from the first gate across the gap to the second. This potential gradient drives electrons from gate 21 to gate 23. It is critical for the potential profile to be monotonic across the gap, as shown, in order for complete charge transfer to occur.

Because of the thin gate oxide, the surface potential under each gate electrode is well-controlled by the applied gate bias. The potential in the gap is substantially less well-controlled, because the distance through dielectric to the respective gates is greater from points on the semiconductor surface in the gap than from points under the gates. Equivalently, gate-dielectric capacitance is higher for surface points under the gates than for points in the gaps.

Ideally, the surface potential in the gap is controlled primarily by the two adjacent gates, with some influence from dopant ions in the underlying depletion layer in the semiconductor. When the two gate potentials differ substantially, the resulting surface potential typically grades monotonically from the first gate to the second. Potential profile 24 in FIG. 2B is typical of these conditions. When the gate potentials are similar or equal, however, a potential barrier is formed in the gap. Surface potential profile 25 in FIG. 2B exhibits such a barrier. This barrier height is larger for larger gaps.

The surface potential is also subject to influence from charges located near the surface of the silicon, as illustrated in FIG. 3. Such charges, 31 in FIG. 3A, can be fixed in the dielectric or trapped in surface states near the semiconductor-dielectric interface. Beneath gate electrodes the effects of surface charges is small and can be modeled as a minor shift in threshold voltage. Surface charges in the gap, however, have a much stronger influence on the surface potential in the gap, because of the relatively weak control of that potential by the gates. FIG. 3B shows three exemplary potential profiles 32, 33 and 34, resulting from different surface-charge densities. In the case of profile 34, the surface-charge density is large enough to induce a potential barrier despite a large gate-voltage difference. The overall gradient of potential profiles 32 and 33 is monotonic, and may therefore have little effect on the overall performance of the CCD shift register.

Fixed surface-charge density and surface-state density and occupancy may differ randomly over the semiconductor surface, resulting in a random distribution of surface-charge density. Consequently different gaps in a CCD structure may have differing surface potential profiles, such as those shown in FIG. 3B.

The occupancy of surface states fluctuates in time as well as spatially. (This fluctuation, causes the well-known flicker noise phenomenon in MOS transistors, for example.) Varying surface-state occupancy causes variation of the surface potential profile in CCD gaps, as discussed above. As a result, different gaps in a CCD structure can have randomly time-varying surface-potential differences due to surface-state occupancy fluctuation.

A single-poly CCD structure with gaps, wherein the gap is implanted is discussed, as well as a method for providing the structure. It should be appreciated that the CCD structure need not be a single-poly structure, for example the structure may comprising an overlapping of two or three poly devices. The structure and method may be applied for all species of CCD, gap, channel and electrode dopant. A doped gap in any CCD structure may be used to split a charge packet into two or more paths. A doped gap and electrode may skim charge from a CCD potential well where the desire is to leave a fraction of the charge behind. A doped gap in any CCD structure where charge flows alternatively through two paths, in which the flows must be matched, is also discussed.

The Charged Coupled Device (CCD), and method for use, may include at least two gate structures configured to hold and/or transfer charge, and a plugged gap situated between two gate structures, the plugged gap further comprising a dopant material.

The plugged gap may be configured to eliminate random affects of surface charges. The plugged gap may comprise two plugged gaps, with each gap may be situated between two gate structures, a transfer charge may be split between the two plugged gaps.

The two plugged gaps are equally matched and the transfer charge may be split according to a ratio determined by gate and active-area geometries. Specifically, the transfer charge may be equally split.

The plugged gap may comprise a self aligned implantation of dopants, where the dopant material may be a p-type or n-type dopant. The plugged gap may also be configured to provide a highly conductive region spanning the entire gap, thereby causing a uniform affect of surface charges along an entire gap region.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1a is a cross-sectional schematic of an example surface-channel CCD shift register;

FIG. 1b is a plan view schematic of the example surface-channel CCD shift register depicted in FIG. 1a;

FIG. 2a is a cross-sectional schematic of two adjacent gates;

FIG. 2b is a surface potential profile of the adjacent gates depicted in FIG. 2a;

FIG. 3b is a schematic of an example surface potential profile of the adjacent gates depicted in FIG. 3a;

FIG. 4b is a schematic of a surface potential profile of the adjacent gates depicted in FIG. 4a.

DETAILED DESCRIPTION OF THE INVENTION

A description of preferred embodiments of the invention follows.

In typical CCD shift register operation, with typical surface-charge densities, clock amplitudes are high enough to produce a monotonic potential profile between gates. Fixed oxide charges and occupied surface-state densities may differ randomly over the semiconductor surface, resulting in a random distribution of surface-charge density. The random distribution of surface-charge density may produce variations in the detailed potential profile in the gaps, such as profiles 32 and 33 in FIG. 3B. As long as the overall gradient remains monotonic, however, normal CCD shift-register operation may not be significantly affected.

CCDs are used not just for shifting charges, however, but also for various signal-processing functions. In CCD signal-processing circuitry, there are various CCD structures in which the charge flows between different gate pairs and must be well-matched for proper operation. As discussed above, variations in surface charges cause variations in gap potential profiles; these variations degrade the matching of charge flows between different gate pairs. For the reasons discussed above, the resulting mismatch has both static and time-varying random components.

The present invention provides a means of eliminating the effects of such charges, thus improving the matching between different CCD gaps.

Figure 4A:
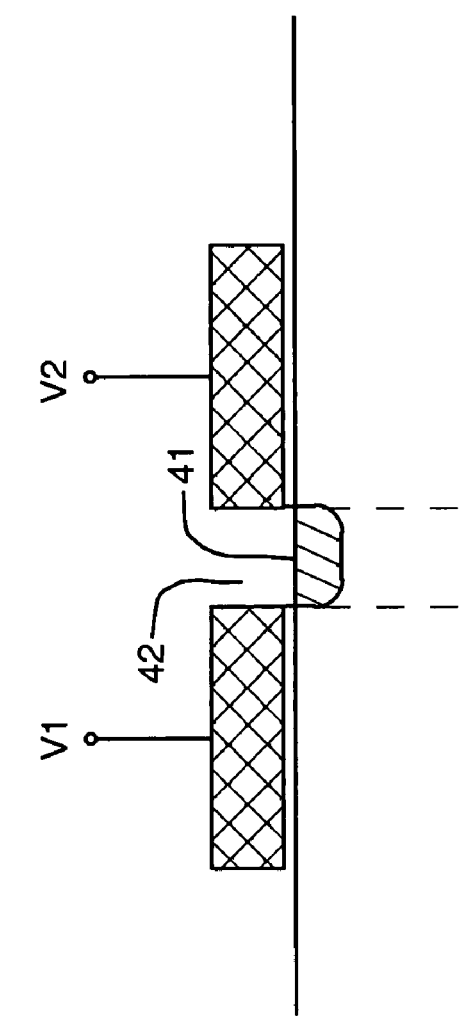
FIG. 4a is a another cross-sectional schematic of two adjacent gates, according to an embodiment of the present invention.
Figure 4B:
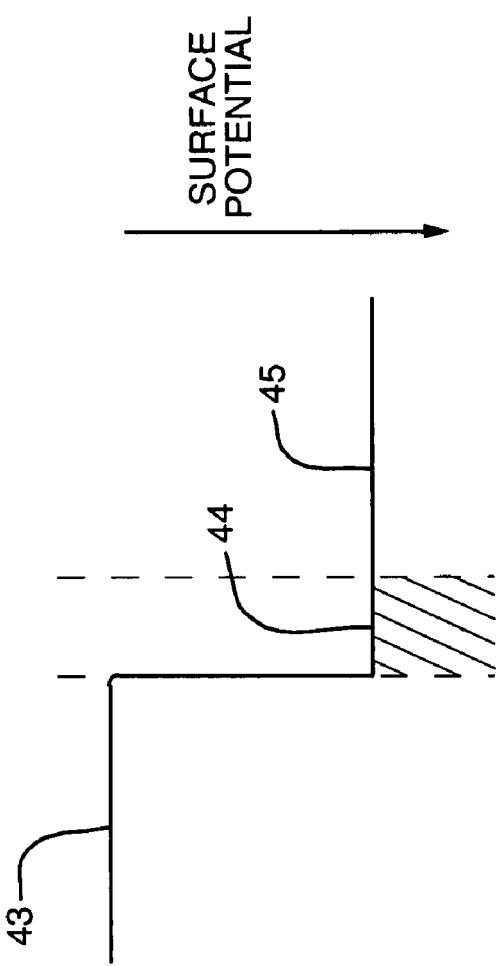

FIGS. 4A and 4B depict an embodiment of the present invention. In FIG. 4A, the structure previously described is augmented by the addition of a highly-doped region 41 in the semiconductor, aligned beneath the gap 42. This region is produced by self-aligned implantation of dopants through the gap. The doped region is referred to in the following text as a "plug." The doped region may comprise, for example, an n-type dopant (i.e. arsenic or phosphorus) in an n-channel Metal Oxide Semiconductor (NMOS) structure or a p-type dopant (i.e. boron) in a p-channel Metal Oxide Semiconductor (PMOS) structure.

Figure 3A:
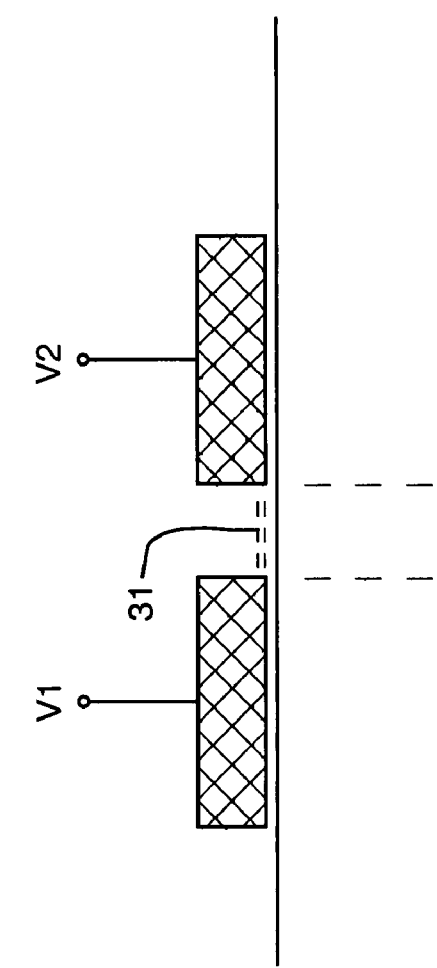
FIG. 3a is a another cross-sectional schematic of two adjacent gates.
Figure 3B:
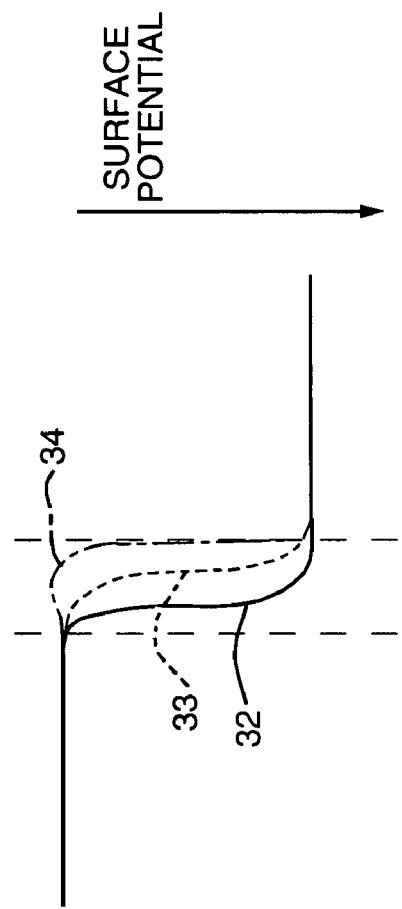

FIG. 4B shows the effect of the plug on the surface potential, with the gates biased as shown in FIG. 3. Because the plug is heavily doped, it provides a highly-conductive region at the semiconductor surface which is not significantly influenced by surface charges. This highly-conductive region completely spans the gap, so that the overall structure has no region where potential is significantly influenced by surface charges; charge conduction across the gap occurs entirely within the heavily-doped plug. Thus the spatial and temporal potential-mismatch effects described above are eliminated. Using the plugged gap method, the overall potential gradient of the two gates and gap (43-45) is monotonic, therefore reducing the random affects of the surface charges.

The process steps used to produce the plug can be the same ones that create the source and drain of ordinary FETs in the same process. For example, shallow trench insulator (STI), local oxidation of silicon (LOCOS), or poly-buffered LOCOS insulations.

Normal charge transfers in a CCD are termed "fully-depleted." This term means that essentially no mobile charges are left under the originating gate at the end of the transfer process. A disadvantage of the plug is that charge transfers across a plugged gap are not fully-depleted. Even though approximately the same number of charge carriers enter and leave the plug during the transfer, a large number of charge carriers are present within the plug at both the beginning and the end of a transfer. Such a non-depleted charge transfer may have two undesirable consequences: (1) the addition of "kTC" noise to the transferred charge packet, and (2) the exhibition of inferior charge-transfer efficiency compared to a fully-depleted charge transfer.

If a complete CCD shift register were constructed with plugged gaps, these effects could severely compromise its performance. If, however, the plugs are used selectively in locations where matched transfers are needed, then the benefits of improved matching can outweigh the negative effects of the plugs.

Figure 5:
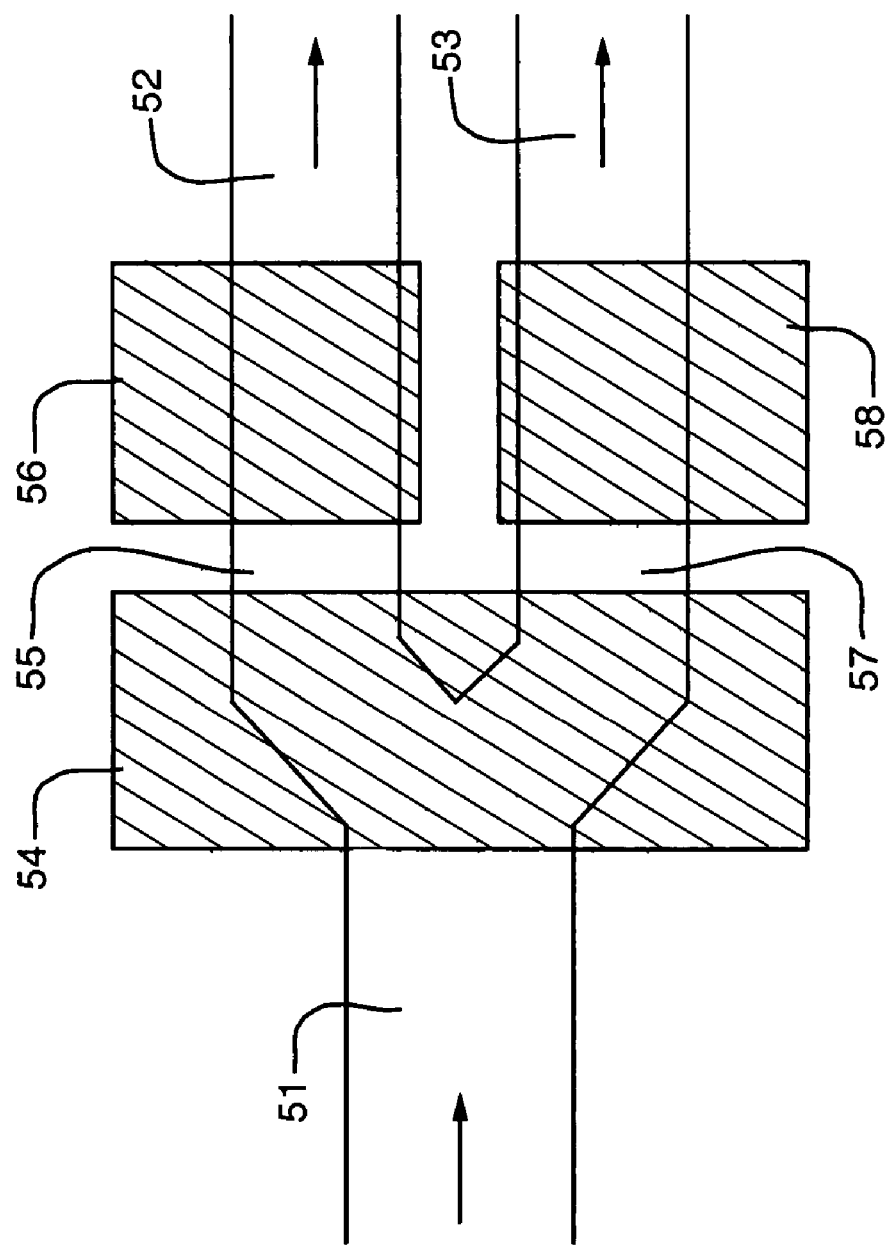
FIG. 5 is an illustration of a charge splitter according to an embodiment of the present invention.

An example of a beneficial use of plugged CCD gaps is shown in FIG. 5. The structure depicted is a "charge splitter," in which a single incoming charge packet is split into two outgoing packets, which continue in separate CCD shift registers. Charge is shifted along the incoming channel 51 (via gates not shown) and stored under gate 54 in the Y-shaped active area beneath that gate. At the next transfer, charge shifts to both gates 56 and 58, via gaps 55 and 57 respectively. If these transfers are well-matched, then the original charge packet splits into the two outgoing charge packets with a ratio determined by the various gate and active-area geometries. If, however, gaps 55 and 57 have differing potential profiles due to different surface-charge densities, then the splitting ratio is disturbed from the nominal geometrical value.

A common application of such a charge splitter is to divide a reference charge packet into two equal halves as part of a charge-domain analog-to-digital converter. In this application, the match between the outgoing packets is paramount: static mismatch, and especially time-varying mismatch, degrade the ADC linearity. Since only the indicated gaps 55 and 57 require matching, only a single transfer stage needs to employ plugs. Moreover, in this application, the charge being split is the same at each operating cycle, so imperfect CTE is not problematic.

Other examples of CCD signal-processing circuitry in which the use of plugged gaps improves performance include static-double-sampling charge generators and charge-skimmers. In a static-double-sampling device the size of each sample should be a function only of the applied input signal, but due to the signal charge traversing a gap, static and time dependant noise is added in with the signal samples. In charge skimmers, a fixed amount of charge is removed from the signal charge packet at each cycle; however since the charge removed traverses a gap on its way to being discarded, static and time dependant noise varies the amount being removed.

In the foregoing description, the transfer of charge between two adjacent gates has been described to illustrate the present invention. The principle of plugged gaps can equally-well be applied to other CCD types, such as 3-phase and 4-phase designs.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of providing a Charged Coupled Device (CCD) comprising:
   providing at least two gates configured to hold and/or transfer charge;
   situating a plugged gap between two gate structures, the plugged gap further comprising a dopant material;
   wherein situating a plugged gap further comprises situating two plug gaps, each gap being situated between two gates, and
   splitting a transfer charge between the two plugged gaps.

2. The method of claim 1 further comprising preventing random affects of surface charges.

3. The method of claim 1 further comprising equally matching the two plugged gaps and splitting the transfer charge according to a ratio determined by gate and active-area geometries.

4. The method of claim 3 further comprising equally splitting the transfer charge.

5. The method of claim 1 further comprising doping the plugged gap with a self aligned implantation.

6. The method of claim 1 wherein the dopant material is a p-type or n-type dopant.

7. The method of claim 1 further comprising providing a conductive region spanning the entire gap, thereby causing a uniform affect of surface charges along an entire gap region.

8. A method of providing a Charged Coupled Device (CCD) comprising:
   providing at least two gates configured to hold and/or transfer a transferring charge;
   equally matching at least two plugged gaps via a matched dopant material;
   situating the at least two plugged gaps between two gate structures; and
   equally splitting a charge among the at least two plugged gaps.

* * * * *